(12) United States Patent
Dakhil

(10) Patent No.: US 10,848,046 B2
(45) Date of Patent: Nov. 24, 2020

(54) ELECTRO-MAGNETIC GENERATOR FOR VEHICLE AND POWER PLANT

(71) Applicant: Farouk Dakhil, Rome (IT)

(72) Inventor: Farouk Dakhil, Rome (IT)

(*) Notice: Subject to any disclaimer, the term of this patent is extended or adjusted under 35 U.S.C. 154(b) by 291 days.

(21) Appl. No.: 16/025,224

(22) Filed: Jul. 2, 2018

(65) Prior Publication Data

US 2020/0007018 A1 Jan. 2, 2020

(51) Int. Cl.

| | |
|---|---|
| *H02K 35/02* | (2006.01) |
| *H02K 7/02* | (2006.01) |
| *H02K 7/075* | (2006.01) |
| *H02K 11/00* | (2016.01) |
| *H02K 11/01* | (2016.01) |
| *H02K 11/30* | (2016.01) |
| *H02S 10/20* | (2014.01) |
| *H01L 35/32* | (2006.01) |
| *B60L 8/00* | (2006.01) |
| *H02K 11/20* | (2016.01) |
| *B60L 50/90* | (2019.01) |
| *B60L 50/30* | (2019.01) |

(52) U.S. Cl.
CPC .............. *H02K 35/02* (2013.01); *B60L 8/003* (2013.01); *B60L 50/30* (2019.02); *B60L 50/90* (2019.02); *H01L 35/32* (2013.01); *H02K 7/025* (2013.01); *H02K 7/075* (2013.01); *H02K 11/0094* (2013.01); *H02K 11/01* (2016.01); *H02K 11/20* (2016.01); *H02K 11/30* (2016.01); *H02S 10/20* (2014.12)

(58) Field of Classification Search
CPC ........ H02K 35/02; H02K 11/01; H02K 11/20; H02K 11/30; H02K 11/0094; H02K 7/025; H02K 7/075; B60L 50/30; B60L 50/40; B60L 50/50; B60L 8/003; H02S 10/20

See application file for complete search history.

(56) References Cited

U.S. PATENT DOCUMENTS

| | | | | |
|---|---|---|---|---|
| 4,532,431 A | * | 7/1985 | Iliev ..................... | F02B 63/04 123/46 E |
| 2008/0012432 A1 | * | 1/2008 | Togare .................. | H02K 53/00 310/24 |
| 2012/0007449 A1 | * | 1/2012 | Gosvener ............... | H02K 33/16 310/23 |
| 2013/0033042 A1 | * | 2/2013 | Fortier ................. | H02K 7/1869 290/54 |
| 2014/0097708 A1 | * | 4/2014 | Simcox ................. | H02K 7/075 310/24 |

(Continued)

OTHER PUBLICATIONS

Nanotech Plus, LLC et al., "Critical National Need: Advanced Composites for Flywheels", 2017; 8 pgs. https://www.nist.gov/sites/default/files/documents/2017/05/09/187_advanced_composites_for_flywheels.pdf.

(Continued)

*Primary Examiner* — Jue Zhang
(74) *Attorney, Agent, or Firm* — Maier & Maier, PLLC

(57) ABSTRACT

An electro-magnetic power generator may be disclosed. The electro-magnetic power generator may include one or more magnetic cylinder which may be wrapped by coils. A controller may coordinate oscillations of the magnetic cylinders by magnetizing the cylinder with the coils, and electric powers are generated by the movement of the magnetic cylinders.

12 Claims, 12 Drawing Sheets

(56) References Cited

U.S. PATENT DOCUMENTS

2014/0117786 A1* 5/2014 Gosvener ............... H02K 7/075
                                                    310/23
2016/0252071 A1* 9/2016 Phillips .................. F03B 13/16
                                                    290/50

OTHER PUBLICATIONS

Stephen P. Holland et al., "Are There Environmental Benefits from Driving Electric Vehicles? The Importance of Local Factors", American Economic Review, Dec. 2016, p. 3700-3730, vol. 106; 31 pgs.

Texas A&M University, "Mountains of waste could lead to new US manufacturing, jobs", May 2017; 2 pgs. https://phys.org/news/2017-05-mountains-jobs.html.

Massachusetts Institute of Technology, "3-D printing with cellulose: World's most abundant polymer could rival petroleum-based plastics", Mar. 2017; 3 pgs. https://phys.org/news/2017-03-d-cellulose-world-abundant-polymer.html.

Li-Dong Zhao et al., "Ultralow thermal conductivity and high thermoelectric figure of merit in SnSe crystals", Nature, Apr. 2014, p. 373-390, vol. 508; 17 pgs.

CSIRO, "Team makes high-quality graphene with soybeans", Feb. 2017; 2 pgs. https://phys.org/news/2017-02-team-high-quality-graphene-soybeans.html.

Xing Sheng et al., "Printing-based assembly of quadruple-junction four-terminal microscale solar cells and their use in high-efficiency modules", nature materials, Apr. 2014, p. 1-6; 42 pgs.

Dong Han Seo et al., "Single-step ambient-air synthesis of graphene from renewable precursors as electrochemical genosensor", Nature Communications, Jan. 2017, p. 1-9; 9 pgs.

Drexel University, "Researchers develop solid-state, free-standing carbon nanofiber supercapacitor", Sep. 2017; 3 pgs. https://phys.org/news/2017-09-solid-state-freestanding-carbon-nanofiber-supercapacitor.html.

Maria Isabel De Barros Bouchet et al., "Diamond-like carbon coating under oleic acid lubrication: Evidence for graphene oxide formation in superlow friction", Nature Scientific Reports, Apr. 2017, p. 1-13; 13 pgs.

Wenyu Zhao et al., "Superparamagnetic enhancement of thermoelectric performance", Nature, Sep. 2017, p. 247-265; 19 pgs.

Jian Li et al., "Paper-based ultracapacitors with carbon nanotubes-graphene composites", Journal of Applied Physics 115, 2014, p. 164301-1 to 164301-5; 6 pgs.

Jonghyun Choi et al., "Hierarchical, Dual-Scale Structures of Atomically Thin MoS2 for Tunable Wetting", American chemical Society—NANO Letters, Feb. 2017; 2 pags.

Swinburne University, "New 3D printed graphene supercapacitors by Swinburne researchers", Jul. 2016; 4 1 pg. hittps://www.graphene-info.com/new-3d-printed-graphene-supercapacitors-swinburne-researchers.

* cited by examiner

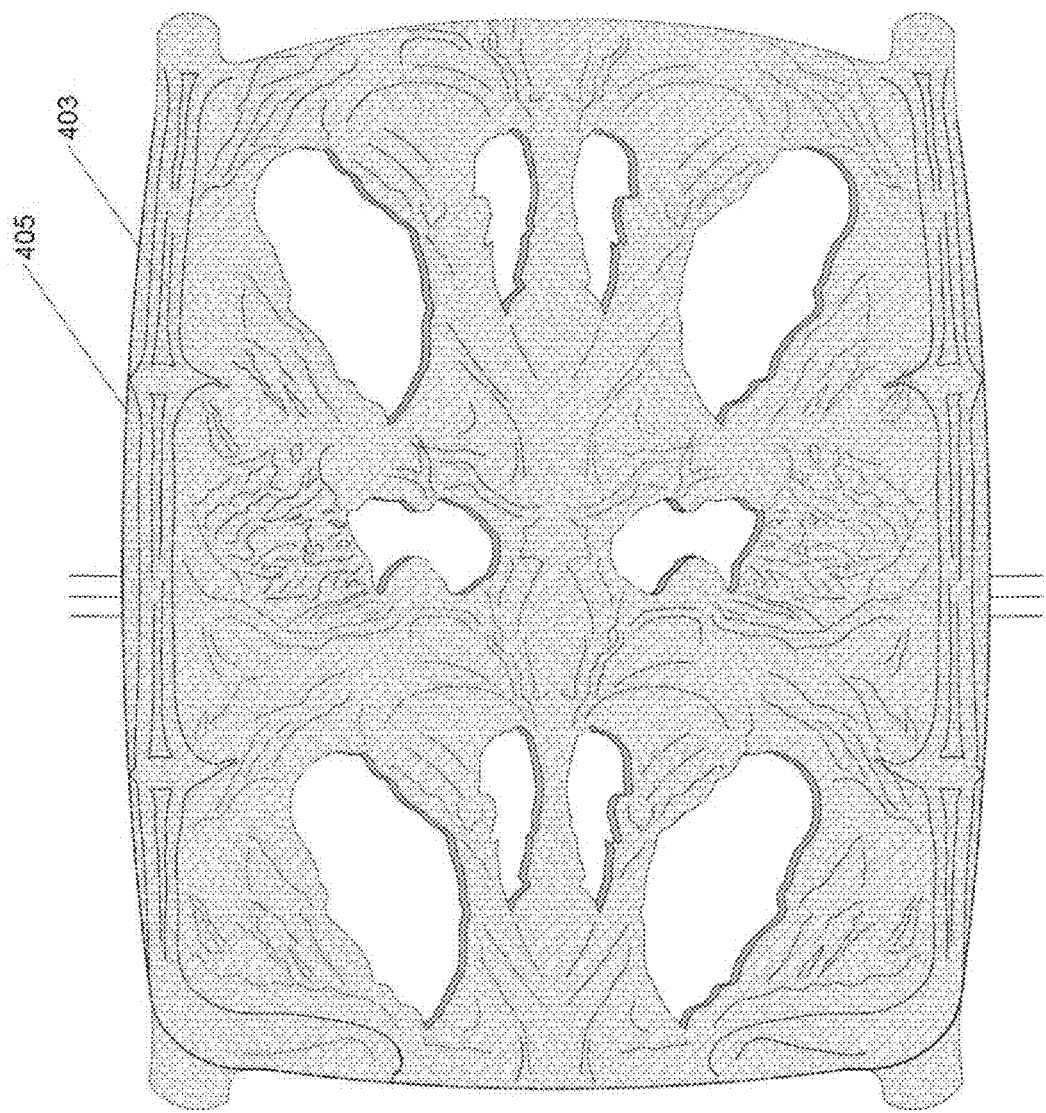

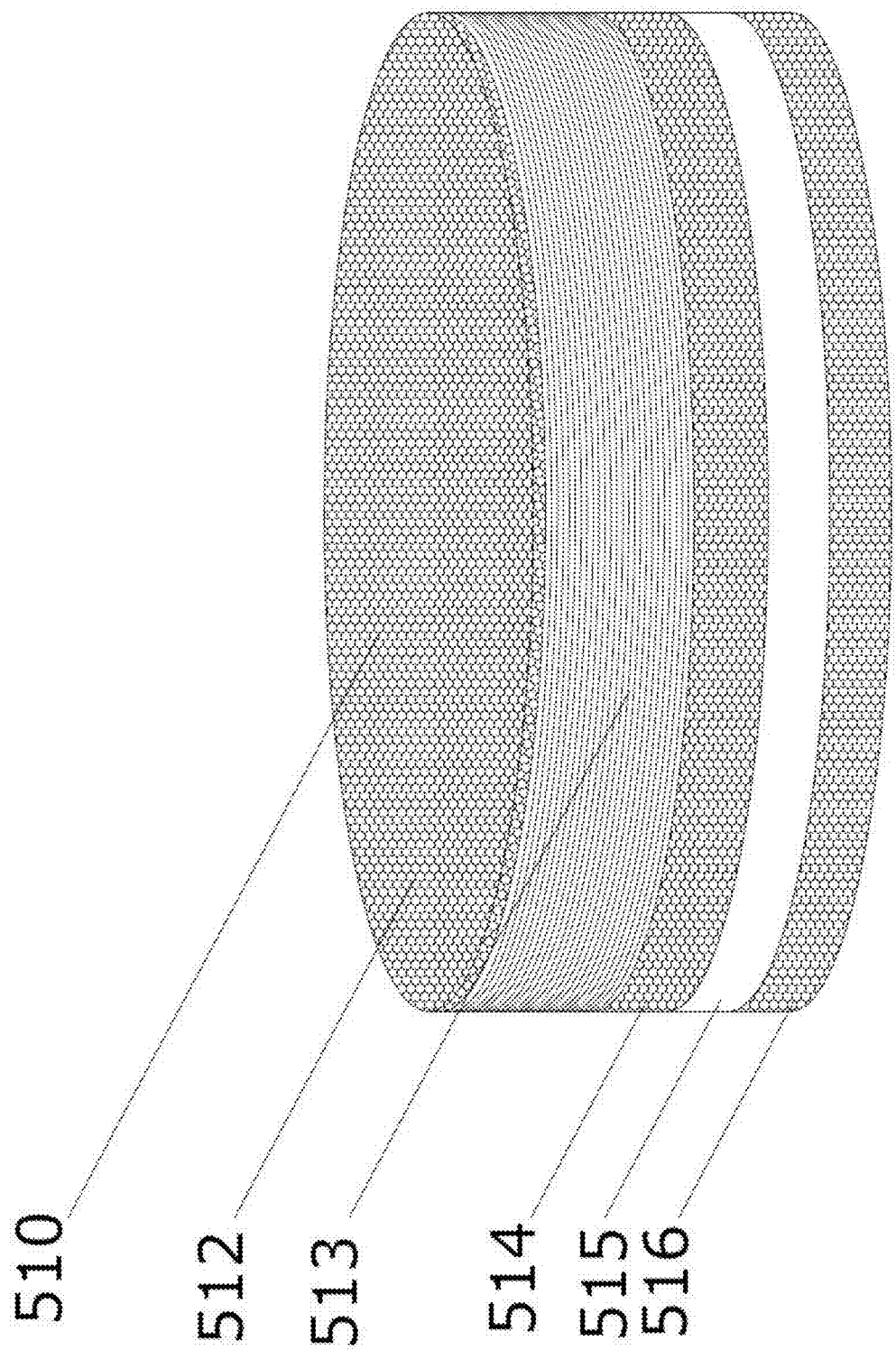

ELECTRO-MAGNETIC GENERATOR FOR VEHICLE AND POWER PLANT

BACKGROUND

In the wake of the agreement in Paris 2015 regarding climate change and the implicated reduction of CO2 in the atmosphere worldwide, a new technology for electro-mobility in automobile cars in which a clean and zero-emission vehicle and in power generation was needed worldwide. According to World's Metrological Organization CO2 concentration in the atmosphere have reached to 403.3 ppm (parts per million) by the end of 2016 which is around 45% above the preindustrial levels. (the critical level is 400 ppm).

The emission of pollutants due to industry and automobiles such as smog-causing sulphur compounds, carbon dioxide, carbon monoxide, and nitrogen oxides has caused ever-increasing problems including health hazards and global warming that are becoming the world's most dangerous and preoccupying matters. In addition, the rapid increase in the demand for automobiles in the Asian market, which has doubled in the last four years, requires an urgent solution. The Earth's population is continuously increasing, requiring more energy and putting pressure on the world community to find reliable and clean solutions for these problems.

Part of the difficulty in addressing the above-mention problems is that there is no comprehensive solution which encompasses the whole cycle of energy production, starting from a non-polluting renewable energy source and continuing to the end user. For example, cars with increasingly-popular electrical motors, fuel-cell, or hybrid engines do not solve the problem because they still rely for the most part on the power plant that would supply the required energy to charge the batteries for the electrical cars or to produce hydrogen, in the case of fuel-cells, from natural gas, etc.

There is a need for a cost-effective, safe, and efficient clean energy production solution which can be implemented using current engineering principles and manufactured without overburdening complexity.

However, today's electro auto-mobility in cars has a real problem which is related to thermodynamics: they have to consume actually more energy to charge and recharge their batteries or split the water in the first place by electro dialysis into hydrogen and oxygen, respectively, than conventional cars' fuel. The energy, in both cases, would have to come from a power source, like power plant for example, which causes even more pollution. Furthermore, the manufacturing of lithium-ion batteries, in particular, is very energy intensive and extensive and, in addition, has huge material consumption like lithium, cobalt, nickel and manganese etc. Therefore, it is the real problem that huge CO2 emissions occur more even than in internal combustion engines in conventional cars. In fact, air pollution in the areas where subsidised electric cars are used could be higher than the area where the only internal combustion engines are used due to the higher consumption of electric power for recharging their batteries, which should be supplied by coal fired power plants. Additionally, Cobalt which is a critical component for all lithium batteries cathodes (negative electrodes) has a very limited supply and mainly produced in a very unstable country, such as the republic of Congo. Moreover, air pollution in a ground-level ozone layer, so-called smog, can reduce even crops (corn, cotton, soya and beans) production in the US besides the known effects on health like asthma and premature death. Therefore, a new technology for electro-mobility in automobile cars is required to solve such a problem.

SUMMARY

According to at least one exemplary embodiment, an electro-magnetic power generator may be disclosed. The electro-magnetic power generator may include: a first magnetic cylinder configured to be wrapped by a first coil; a second magnetic cylinder configured to be wrapped by a second coil; a first piston configured to be coupled to the first magnetic cylinder; a second piston configured to be coupled to the second magnetic cylinder; at least one dynamo generator configured to be coupled with the first magnetic cylinder and the second magnetic cylinder via at least one moving arm; at least one controller configured to coordinate oscillations of the first magnetic cylinder and the second magnetic cylinder; and at least one electric power storage. In an exemplary embodiment, the at least one controller controls the at least one electric power storage to supply a current to the first coil and the second coil for the first magnetic cylinder and the second magnetic cylinder to have a magnetic polarity creating a repulsion force against each other of the first magnetic cylinder and the second magnetic cylinder, and the first piston and the second piston are compressed by the repulsion force and released to push back the first magnetic cylinder and the second magnetic cylinder. Also, in an exemplary embodiment, the at least one dynamo generator generates an electric power by the oscillations of the first magnetic cylinder and the second magnetic cylinder, and the generated electric power is stored in the at least one electric power storage.

According to another exemplary embodiment, an electro-magnetic power generator may include: at least one magnetic cylinder; at least one magnetic blade configured to be wrapped by a coil; at least one controller configured to coordinate oscillations of the least one magnetic cylinder with rotations of the at least one magnetic blade; at least one shaft configured to be coupled to the at least one magnetic blade; and at least one electric power storage. in an exemplary embodiment, the at least one controller controls the at least one electric power storage to supply a current to the coil for the at least one magnetic blade to have a magnetic polarity creating a repulsion force against the at least one magnetic cylinder. Also, in an exemplary embodiment, the at least one shaft generates an electric power with a stator by using the rotations of the at least one magnetic blade, and the generated electric power is stored in the at least one electric power storage.

BRIEF DESCRIPTION OF THE FIGURES

Advantages of embodiments of the present invention will be apparent from the following detailed description of the exemplary embodiments. The following detailed description should be considered in conjunction with the accompanying figures in which:

Exemplary

Exemplary

Exemplary

Exemplary

Exemplary

Exemplary

Exemplary

Exemplary FIG. 4a shows an exemplary T-rex bone structure on the roof top.

Exemplary

Exemplary

Exemplary FIG. 5 shows an exemplary thermoelectric cell.

Exemplary

DETAILED DESCRIPTION

Figure 1:
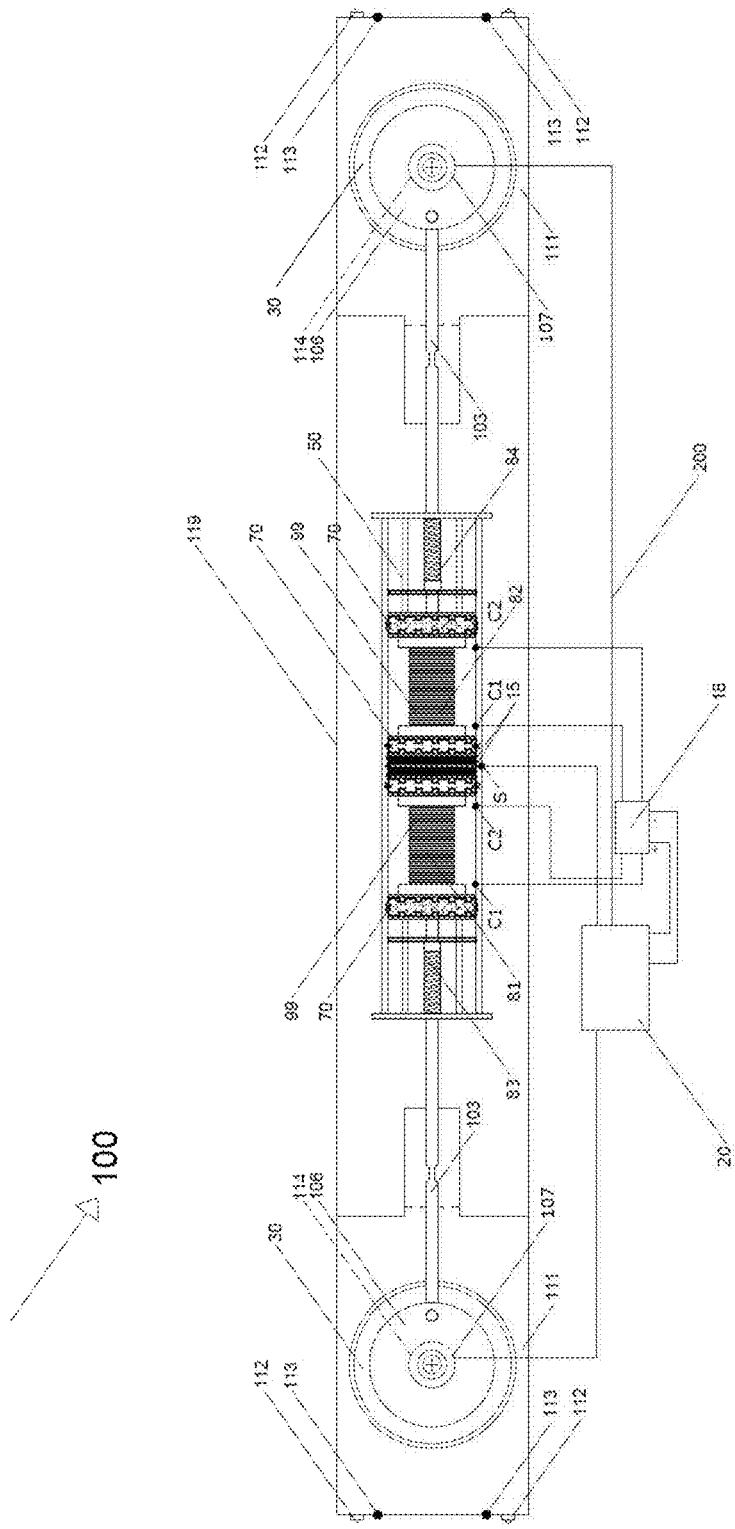
FIG. 1 shows an exemplary arrangement of a magnetic cylinder generator mechanism.

Aspects of the invention are disclosed in the following description and related drawings directed to specific embodiments of the invention. Alternate embodiments may be devised without departing from the spirit or the scope of the invention. Additionally, well-known elements of exemplary embodiments of the invention will not be described in detail or will be omitted so as not to obscure the relevant details of the invention. Further, to facilitate an understanding of the description discussion of several terms used herein follows.

As used herein, the word "exemplary" means "serving as an example, instance or illustration." The embodiments described herein are not limiting, but rather are exemplary only. It should be understood that the described embodiment are not necessarily to be construed as preferred or advantageous over other embodiments. Moreover, the terms "embodiments of the invention", "embodiments" or "invention" do not require that all embodiments of the invention include the discussed feature, advantage or mode of operation.

According to at least one exemplary embodiment, an electro-magnetic generator may be disclosed. The electro-magnetic generator may include one or more magnetic cylinders and a solar photovoltaic panel on a roof top which may supply complementary power for booting a system as an outside power supply and may function in one or more ways in combination with a dielectric elastomer to efficiently produce electricity. Further, systems to retain excess energy for later use, such as solar roof top, a flywheel and a battery may be employed in an exemplary embodiment.

According to an exemplary embodiment, rare earth metals powerful neodymium magnets and high power density DE (Dielectric Elastomers) and CNT (Carbon Nano-Tubes) barrier as a magnetic shielding material may be used. The CNT may be used in order to protect the surroundings of a magnetic system from any interferences which may be caused by a strong magnetic effect of magnetic cylinders on any magnetic ferrous material in the vicinity of an electromagnetic system. According to an exemplary embodiment, the electro-magnetic system may replace all the complex and heavy ballast of an IC engine. An exemplary embodiment may obey the laws of thermodynamics, in particular, the second law entropy. Thus, the mechanism of an exemplary embodiment may have an open energy system.

According to an exemplary embodiment, a roof top of a vehicle may have an integrated imprinted micro lenses flexible panel that may generate solar-electric power to keep one battery inside the vehicle being charged in order to reboot a magnetic power generating system. Also, in an exemplary embodiment, solar photovoltaic cells may be made of Gallium Arsenide GaAs or photo-voltaic perovskite flexible cell panel and/or any other heat resistance material. There may be one or more battery and/or super capacitor in the system for the case of rebooting the system, which may be caused by friction and/or air resistance.

Further, according to an exemplary embodiment, in order to reduce the weight, the body of the vehicle may be made of, for example, 200 times stronger than steel carbon fibres composites of low cost soya bean oil graphene sheets. Also, both body of vehicle and micro-lenses may be made of lignin carbon fibres which is a waste by product of paper industry (paper pulp manufacturing plant) where hundreds of millions of tons of lignin is produced as waste. Lignin may thus, represent a huge cost reduction for car manufacturing industry and indeed is green bio-degradable and recyclable material. Also, according to an exemplary embodiment, a bone-like structure may be used in the vehicle. Additionally, the vehicle body may be built with a 3D and 4D (in-time self-healing composite smart materials) printing system.

Turning now to exemplary FIG. 1, FIG. 1 may show an exemplary arrangement of a magnetic cylinder generator mechanism 100. According to an exemplary embodiment, a vehicle/power generation plant may have both a fly wheel 30 and a dynamo integrated with a carbon reinforced composite junction 103. According to an exemplary embodiment, such a configuration may have several advantages: i) The compactness of the power generator (dynamo) and the flywheel 30 may make the embodiment ideal and flexible in its application as for a four wheel vehicle motor cycle, three-wheel vehicle or even one-wheel bike; ii) The hand wrist inspired "tendons" placed at the joint of a moving arm (the carbon reinforced composite junction) 103 may give many advantages such as no maintenance, no moving parts as in a hinge and more robust and strong as these "tendons" are made of carbon reinforced composite that is, for example, 200 times stronger than steel; and iii) According to an exemplary embodiment, two magnetic cylinders (81 and 82) may be replaced by two iron, steel, nickel cobalt or perm alloy (a mixture of iron and nickel) or samarium SmCo or any other magnetic ("magnetic cylinder") material. The two magnetic cylinders (81 and 82) may be wrapped in electricity conducting coils 99 into which current is conducted from battery 18. According to an exemplary embodiment, a wall 15 may be a conducting plate which may have sensors (S) to transmit a signal to a control device 20 at the moment of impact of the two bars (the two magnetic cylinders) 81/82. At that moment, the current from the battery 18 may flow through contacts (C1 and C2). Thereafter, an electric motor may not be needed because pistons and single crank shafts may generate electric power driven by the oscillating bars (the two magnetic cylinders) 81/82.

Referring still to exemplary FIG. 1, an embodiment may also be equipped with another sensors 113 with digital cameras 112 which may be placed at both front and rear (for 3D vision) of the vehicle/motor cycle in order to activate the break system (and thus may start the fly wheel 30 to store braking energy) once the camera 112 and/or the sensor 113 detect an obstacle, animal, human being, a red signal, or etc. Further, in another exemplary embodiment, rails 50 under the two magnetic cylinders (81 and 82) may be replaced by a half cylinder plated with Teflon and/or solid lubricant for low friction surface coatings with highly robust and low cost material such as $MoS_2$ to allow minimal friction during the oscillation of the two magnetic cylinders (81 and 82) and thus reduce energy loss. Also, in an exemplary embodiment, heat may be generated by the oscillation of the two magnetic cylinders (81 and 82) due to friction, and the heat may be conducted to the floor of the inside of the vehicle via cupper tubes and/or air duct channels.

Referring still to exemplary FIG. 1, in an exemplary embodiment, a repulsive magnetic assembly may use the magnetic forces generated by electric current from battery 18 into magnetic cylinders 81/82 through contacts (C1 and C2) at the moment of impact of the two magnetic cylinders 81/82. The two magnetic cylinders 81/82 may be placed with their equal poles (positive or negative) against one another to create a repulsion force at each time current is flown into the coil 99. Pistons (83, 84) may be coupled to the end of each magnetic cylinders 81/82 such that they would be compressed due to the repulsion force by each magnetic cylinder 81/82. The repulsion of magnetic cylinders 81/82 may push the magnetic cylinders 81/82 away from each other, thereby compressing pistons 83/84 to a predetermined maximum point. Inside pistons 83/84 there may be springs which may then be released to push back magnetic cylinders 81/82 substantially to their initial position. The movement and release of the springs may be controlled by sensors. Pistons 83/84 may be placed on railways 50 which may be also a semi cylinder made of Teflon or $MoS_2$ material to ensure their straight line and direct movements and the movements of magnetic cylinders 81/82 with minimum friction. Said movements of magnetic cylinders 81/82 and pistons 83/84 on said railways may create heat by friction which could be, if high enough, bring a highly conductive thermal oil into a turbine (not shown) in order to generate electricity or to heat the inside of the vehicle. Further there may be included dielectric elastomer (DE) cushions 70. The cushion 70 may be pushed along rails 50 by sensor plate 15 with sensor S to instigate the flow of current inside coil 99 in order to allow the two magnetic cylinders 81/82, with same pole of charge, to reach their original/initial position in a continuous oscillation at high speed. When magnetic cylinders 81/82 return to their initial position due to the spring force of the two magnetic cylinders 81/82, the walls of cushion 70 may push against one another deforming the DE material inside which is sandwiched in a flexible coated non-paramagnetic but current conductive material that forms the electrodes of the N-P-junction plates, exerting a pressure on said DE material and thus generating a current which may then be fed to a battery 18. According to an exemplary embodiment, the dielectric elastomer (DE) layer may be made of multiple layers to increase power generation.

Referring still to exemplary FIG. 1, a sensor-plate 15 may be placed between the two magnetic cylinders (81 and 82) in order to instigate the flow of electric current from battery 18 inside the two magnetic cylinders (81 and 82) at the moment of impact of the two magnetic cylinders (81 and 82), which may be made of iron, steel or any other magnetic material. According to an exemplary embodiment, Magnetic Force or Magnetic Intensity (H) of the generated magnetic field within the magnetic cylinders (81 and 82) may be described by the following equation. The Magnetic Intensity may be defined as the number of ampere-turns (=nI) per unit length.

$$H = I \times N/L \qquad \text{[Equation 1]}$$

While $H = I/2\pi r$ and where:
H is the strength of the magnetic field in ampere-turns/metre (At/m);
N is the number of turns of the coil;
I is the current flowing through the coil in amps (A); and
L is the length of the coil in metres (m).

The Equation 1 may show that the strength of the magnetic force is dependent upon the current flowing through the coil 99, the number of turns of the said coil 99 and indirectly proportional to the diameter of the cylinder (81 and 82) and the length of the coil 99 in meters. However, the electric power needed may be minimal and for only short time in seconds i.e. the energy consumed is very small each time once the magnetic cylinder becomes magnetic (i.e. The electrons within the material are aligned and thus the cylinder becomes practically a magnetic cylinder). Thus, according to an exemplary embodiment, once the electric current from battery 18 has been switched off and removed, the magnetic field forces within the cylinder may be no more magnetic and the cylinder becomes demagnetized and there would be no need for more current to flow through the coil from the battery 18. Accordingly, much current may not need for this process to occur repeatedly as the two cylinders (81 and 82) oscillate. The direction of the current may determine the polarity of the magnetic cylinder (81 and 82).

Referring still to exemplary FIG. 1, an exemplary embodiment may have to be placed in a magnetic shielding case 119 in order to protect the surrounding environment of the vehicle or building where the system is placed to avoid any interference with the strong magnetic flux herewith produced. According to an exemplary embodiment, the material of magnetic shielding case 119 may be CNT (Carbon Nano-Tubes) material.

Referring still to exemplary FIG. 1, the magnetic power generator 100 may utilize at least two magnetic cylinders 81/82 made of iron, steel or other powerful appropriate magnetic material to produce electrical power for electric motors and/or to be stored in a flywheel 30 and or battery 18. However, said magnetic cylinder 81/82 may be made of also several, in each other interlocked and insulated, Russian-dolls-like, multi-coil-wired cylinders in such a way that the magnetic field force would be multiplied. The coils 99 may be well insulated by fiber glass cylinder-like material placed between each magnetic cylinder 81/82 building said Russian dolls-like multiple magnetic cylinders one inside the other multiplying over all magnetic force.

Referring still to exemplary FIG. 1, according to an exemplary embodiment, the flywheel 30 may be placed within the system assembly 100 to store produced electric power by compressed and uncompressed DE material and/or any unused work done by the oscillation mechanism device at all times and in particularly during braking. The flywheel 30 may also provide power for the system 100 when energy is necessary to reboot the system 100, for example, to bring back the two magnetic cylinders 81/82 in their original position close to one another in order to exert their repulsion forces and thereby restart the oscillation. However, due to friction and air resistance within the system 100, the necessary energy to reboot the system 100 may at some time be supplied by an external source such as a panel of solar photovoltaic with micro-lenses 401 on top in order to concentrate light onto the said solar cells which will recharge the battery 18 whenever needed. Preferably, an external supply of energy may be available whenever necessary such that at all times the magnetic cylinders 81/82 may be brought back to their close position with the separation wall in between the magnetic cylinders 81/82, thereby rebooting the system 100. To reduce the external energy needed for the rebooting of the system 100 and to increase its efficiency friction, a lubricant, for example a nano/micro structure lubricant may be used as desired. Additionally, the entire system 100 may be encapsulated in a vacuum to reduce air resistance.

According to an exemplary embodiment, the flywheel 30 may include a time gear 114 (shown in FIG. 1a) with which function and control of the flywheel 30 may be regulated. At times when the vehicle breaks, the flywheel 30 may start storing the energy. Also, when the vehicle climb a hill or whenever the two magnetic cylinders 81/82 are slowing down or stopping, the flywheel 30 may provide the power for the rebooting. The flywheel 30 may be made of fiber glass and/or maybe made of carbon lignin composite, in order not to interfere with the magnetic flux of dynamo stator or the whole system.

According to an exemplary embodiment, the electrical current produced by the compression and decompression of the DE elements may also be conducted to battery 18. The power stored in the flywheel 30 and in the battery 18 may eventually provide electrical energy for any external device application such as a hybrid car or a power plant, but also to supply power for electric control device 20 for the coordination of the movements of magnetic cylinders 81/82.

Also, in an exemplary embodiment, as described above, the flywheel 30 may have a timing gear 114 that may ensure maximum and efficient force transmission to the speed transmission system and rebooting the system in case of loss of oscillation due to friction and other counter forces like aerodynamics. The flywheel 30 may be accelerated to a maximum when the magnetic device is decelerated (as in vehicles) and hence storing most of this energy in flywheel 30 during an idle time. The demands for peak power thus may be supplied by the flywheel 30 and not by the magnetic device in order to avoid the long stalling problem of conventional electromagnetic motors. For this reason, the flywheel 30 may be necessary to start up the motion of a hybrid vehicle.

According to an exemplary embodiment, the pistons 83/84 may be special pneumatic pistons that may be compressed to a maximum before they release their compressed forces. As the two magnetic cylinders draw back, their repulsion force may decrease as well until they reach the total compression of the pistons that would then push them back towards said separation wall 15. Further, the pistons 83/84 may have valves which can release their compressed force only at the end of its total compression. The use of vales with pistons may reduce resistance to the flow of liquid inside the piston and can improve its efficiency. In addition, it may be possible to capture the heat produced by the system due to friction, air resistance and braking by encapsulating the surrounding of the magnetic cylinders by a nonmagnetic, diamagnetic and heat resistant material in such a way that the generated heat can be drawn by a coolant like molten salt that is then conducted to boil water in order to turn a vapor turbine to generate electricity.

According to an exemplary embodiment, the magnetic repulsion forces generated from the magnetic fields of the two magnetic cylinders 81/82 may be used to move conventional single crank shaft 106 through a tendon-like (hand wrist-like) carbon fibers reinforced composite flexible junction 103 in a circular and continuous movement to get the ends of the crank shaft 106 to circulate inside a stator of a conventional dynamo or electrical generator. Pistons 106 may then move the magnetic cylinders backward in order to bring them to their initial position near one another and thus the magnetic repulsion force would once more be exerted upon them.

In each of the described embodiments, attempts may be made to allow the system to continue running as long as possible for every unit of energy inputted. However, none of these embodiments are perpetual motion machines as friction, even if minimized, may continually slow down and eventually stop the system, requiring an external source of energy to reboot the system.

The embodiments as described above may be applied for large devices and could be arranged in a series of devices interconnected with one another to produce the required energy needed. For example, for the generation of large energy supply to operate different electric motors, engines or even power plants a series-connected arrangement may be used. To assist in the design of such a structure, the following equation may be used:

$$P_{eq} = \varepsilon_0 \varepsilon_r \frac{V^2}{Z^2}$$ [Equation 2]

Where $P_{eq}$ is the equivalent electromechanical pressure, V is the voltage, $\varepsilon_0$ is the vacuum permittivity, $\varepsilon_r$ is the dielectric constant of the material, and Z is the thickness of the elastomer film/material (The equivalent electromechanical pressure $P_{eq}$ is twice the electrostatic pressure $P_{el}$).

Figure 1A:
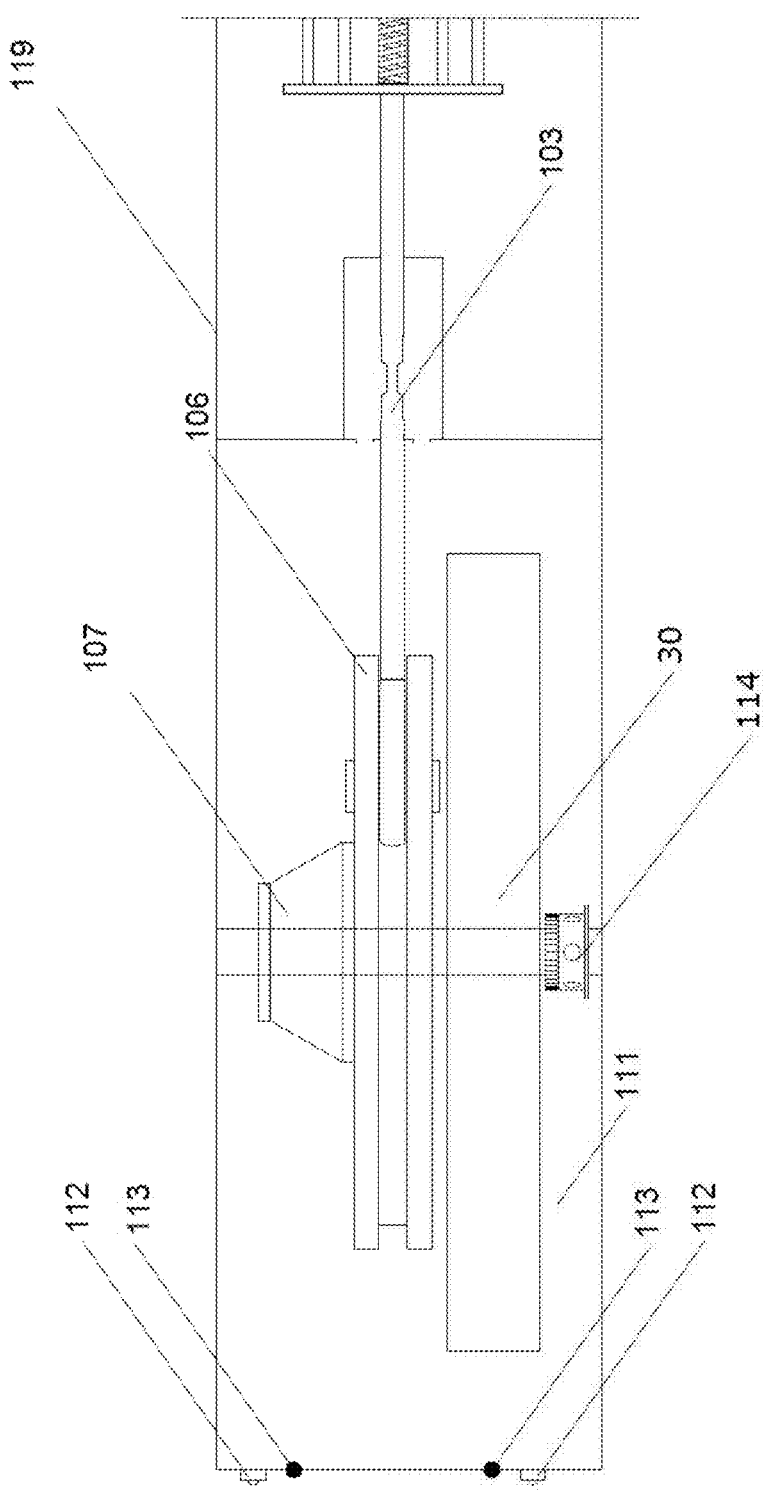
FIG. 1a shows a side view of an exemplary arrangement for the magnetic cylinder generator mechanism.

Turning now to exemplary FIG. 1a, FIG. 1a may show a side view of an exemplary arrangement for the magnetic cylinder generator mechanism. According to an exemplary embodiment for the magnetic cylinder generator mechanism 111, the single crank shaft 106 may be used, with which a rotation of a dynamo generator 107 produces an electric power for the system 100. Also, in an exemplary embodiment, a flywheel 30 may be coupled with a timing gear 114. Additionally, the system 100 of a vehicle may have double digital cameras 112 for three-dimensional object recognition and sensors 113 in order to stop the vehicle whenever an obstacle or red light is registered by said sensors 113 and/or cameras 112.

Figure 1B:
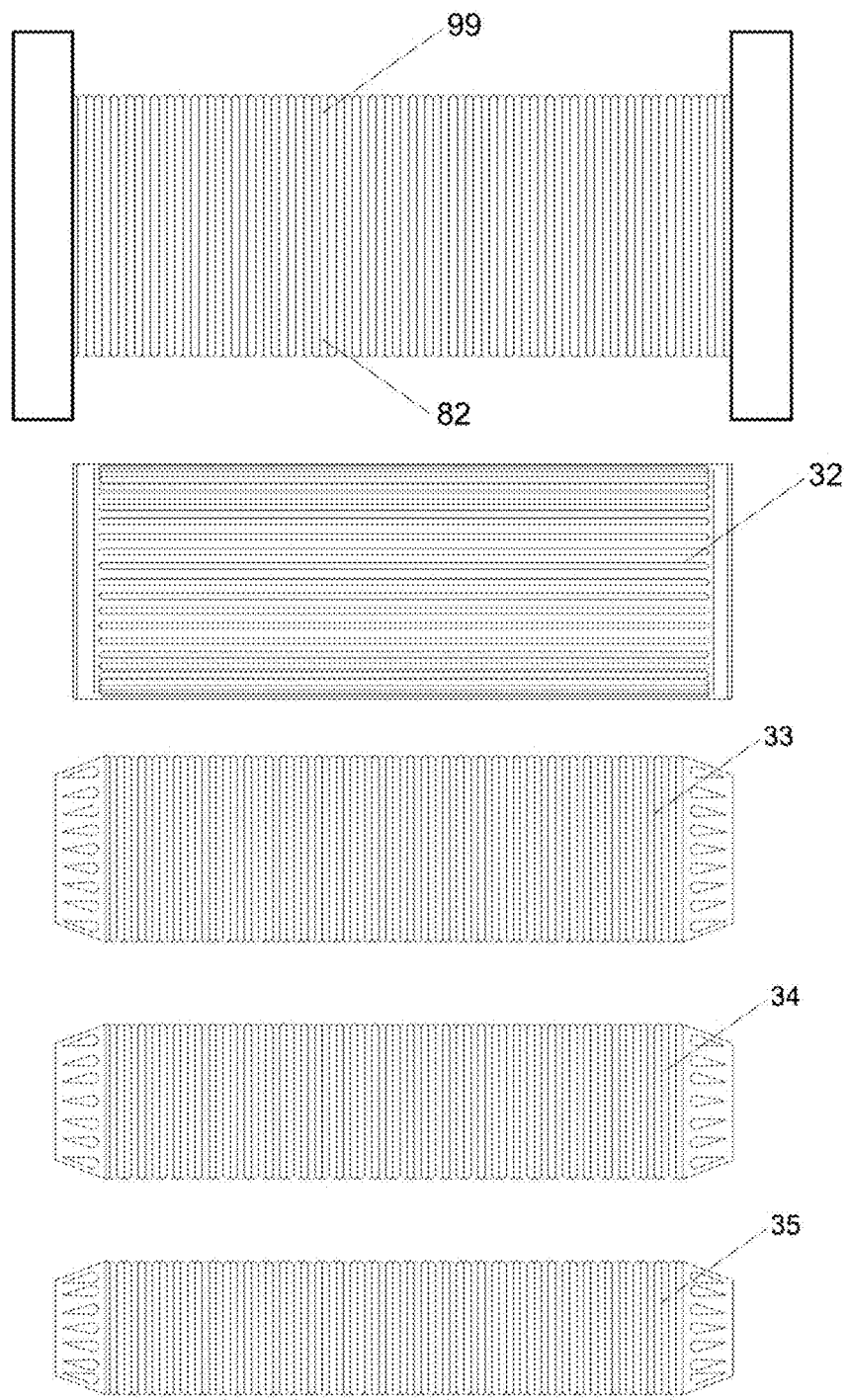
FIG. 1b shows exemplary pluri-magnetic cylinders with their fiber glass insulator arrangement.

Turning now to exemplary FIG. 1b, FIG. 1b may show exemplary pluri-magnetic cylinders with their fiber glass insulator arrangement. According to an exemplary embodiment, the wiring of the coil 99 may be used, through which the current of the battery 18 may flow to magnetic cylinder 81/82. Further, in an exemplary embodiment, the magnetic cylinder 82 (or 81) may have inside several magnetic cylinders: the magnetic cylinder 82 may have another one or more magnetic cylinders (33, 34 or 35) which are each separately wired and insulated by fiber glass insulator 32 whereby each cylinder (33, 34 or 35) and corresponding fiber glass insulators 32 may have smaller diameter than the magnetic cylinder 81/82.

Figure 2:
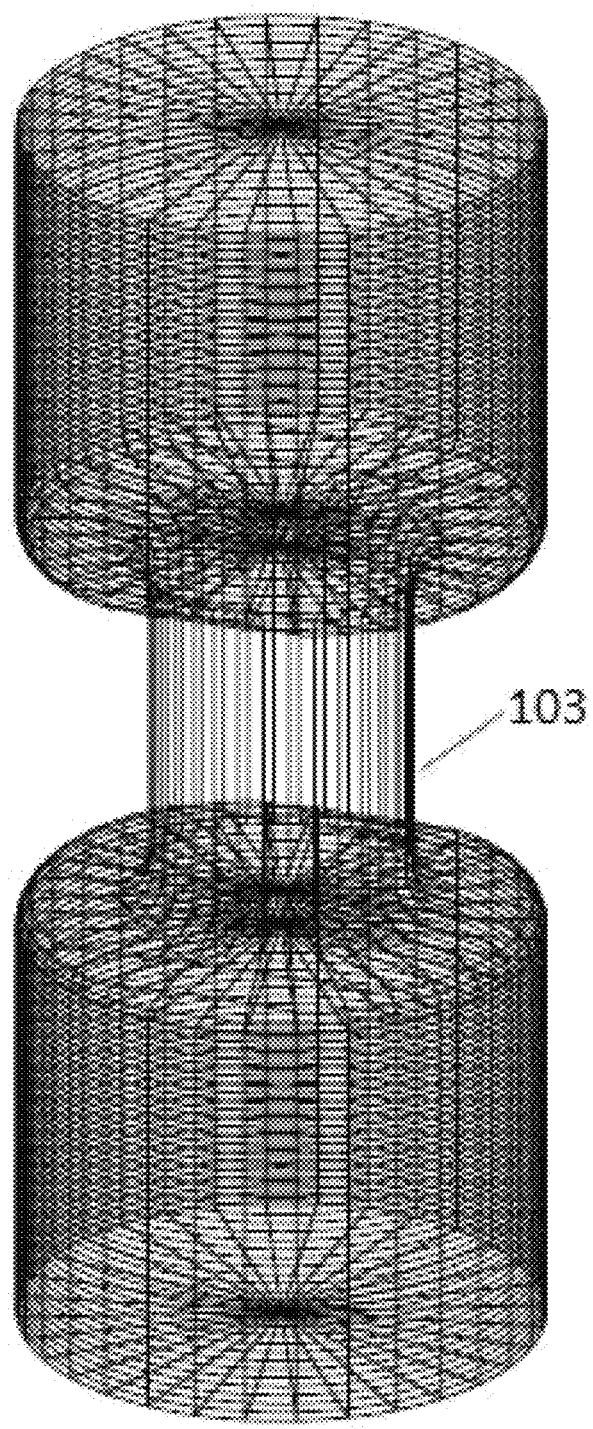
FIG. 2 shows an exemplary flexible carbon reinforced junction arrangement.

Turning now to exemplary FIG. 2, FIG. 2 may show an exemplary flexible carbon reinforced junction arrangement. According to an exemplary embodiment, a carbon reinforced flexible tendon like junction 103 may allow the circular movement of the single crank shaft 106 described above.

Figure 3:
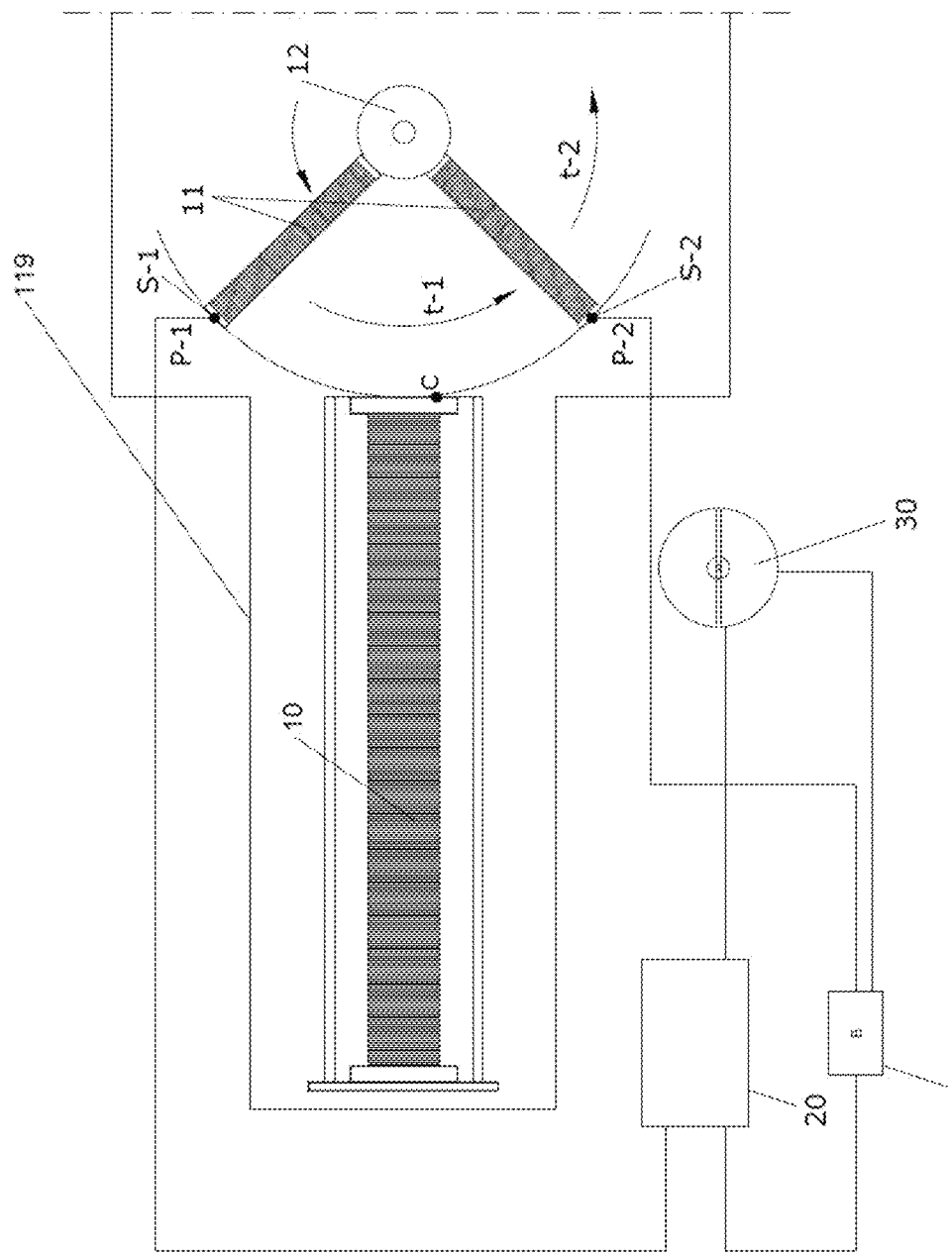
FIG. 3 shows another exemplary embodiment of repulsive magnetic cylinders assembly configuration.

Turning now to exemplary FIG. 3, FIG. 3 may show another exemplary embodiment of repulsive magnetic cylinders assembly configuration. As described above, in an exemplary embodiment, a repulsive magnetic assembly may use the magnetic forces generated by electric current from battery 18 into magnetic cylinders 81/82 through contacts (C1 and C2) at the moment of impact of the two magnetic cylinders 81/82. According to another exemplary embodiment, a magnetic generator mechanism 10 may include at least one magnetic cylinder directed towards a magnetic blade 11 placed at the center of the mechanism-device which may function as a free rotating blade. The blade 11 may be made of the magnetic cylinder material through which current, at a precise moment and only for a very brief time period, may be flown to the magnetic blade 11 and simultaneously to magnetic cylinder 10. Thus, the magnetic cylinder 10 and magnetic blade 11 may be positioned with equal poles directed toward one another in order to produce a repulsion force between the magnetic cylinder 10 and magnetic blade 11 once the current from battery 18 flows through coils in both magnetic cylinder 10 and magnetic blade 11.

Referring still to exemplary FIG. 3, the magnetic cylinder 10 may be placed in such a way that its magnetic equal (+ve or −ve pole) force is substantially directed at the other magnetic blade 11. There may be a point of time in which the magnetic cylinder 10 and magnetic blade 11 reach nearer to one another, referred to as the "point of incident" (PI). PI is the point of time when the magnetic cylinder 10 and magnetic blade 11 come near enough to one another in order to repel one another and thus the blade 11 may continue to rotate. Once the blade 11 passes a critical point P (P-1 or P-2), the magnetic force of magnetic cylinder 10 may drive the blade 11 by repulsion in an anti-clock-wise direction (t-1/t-2: the direction may also be clock-wise direction as desired by controlling the polarity).

Referring still to exemplary FIG. 3, the blade 11 may be welded to a metal shaft 12 which may rotate in a circular motion as the blades set in motion by the force of the magnetic field exerted by the magnetic cylinder 10 upon the blade 11. Around the central shaft, there may be a stator (generative coil housing) which may produce electricity as the shaft 12 rotates inside this stator. In an exemplary embodiment, the shaft 12 is welded to said blades 11 substantially at the center of this electromagnetic assembly.

Referring still to exemplary FIG. 3, The magnetic field of magnetic cylinder 10 may only be magnetic at the moment when the blade 11 has just reached position C which may be slightly downward of the critical point (P-1) to make sure that the current flows only when the blade 11 has passed the critical position (P-1 or P-2) for the actual repulsion forces to be took place and also the contact point at which time only current would flow from battery 18 in order to magnetize both cylinder 10 and blade 11 to push it further into an ever faster accelerated angular motion. There may be sensors, S1 and S2, each placed at critical positions, P1 and P2. The sensors may signal for each critical position of the magnetic cylinder 10 with the blade 11. Once blade 11 and magnetic cylinder 10 have reached P1, the work (energy) done by magnetic cylinder 10 and blade 11 may be transmitted to the flywheel 30 for storage and eventually can be used for rebooting the system from stored electrical power inside the flywheel 30 or from an external battery 18. Thus, the blades 11 may then receive only the repulsion or "push-force" from magnetic cylinder 10 to continue its rotations in one direction (t-1/t-2) at all times. Additionally, the rebooting of the system may also be powered by the solar electric energy produced on the roof top 407 (composed of several layers as shown in exemplary FIG. 4) of vehicle and/or building of a power plant in order to keep the battery 18 charged at all times. According to an exemplary embodiment, the whole system may be controlled and wired 200 by an overall electronic central unit 20 which also controls other components of the system 100.

Also, in an exemplary embodiment, all other components around the magnetic cylinders 10 and blade 11 may be constructed of a material which is non-magnetic and may not be attracted by the magnetic cylinders. Such a material may be aluminum or carbon alloys. Also, the whole magnetic embodiment may be placed inside a CNT case 119 in order to shields the system from the environment for all reasons of interference with any other metallic objects herein or around the arrangement.

According to an exemplary embodiment, the sensors may be programmed by software in such a way that the movement of magnetic cylinder 10 is coordinated and substantially synchronic to blade 11 to receive the maximum amount of magnetic repulsion or push to continue its angular revolution on its axis 12. After an initial repulsive "push," the blade 11 may continue to move in its circular movement at higher velocities as controlled by hardware device 20. According to an exemplary embodiment, the system 100 may need to be placed in a vacuum to reduce air resistance on the moving blade 11. Additionally, a recycling coolant or water radiator (not shown) may ensure low temperatures and reduce frictional heat produced by the blade circular movement and may assist in obtaining higher speeds and efficiency. The rotary-shaft 12 may be embedded in a shielded magnetic field or connected to a variable transmission system (not shown) to generate electricity.

Figure 3A:
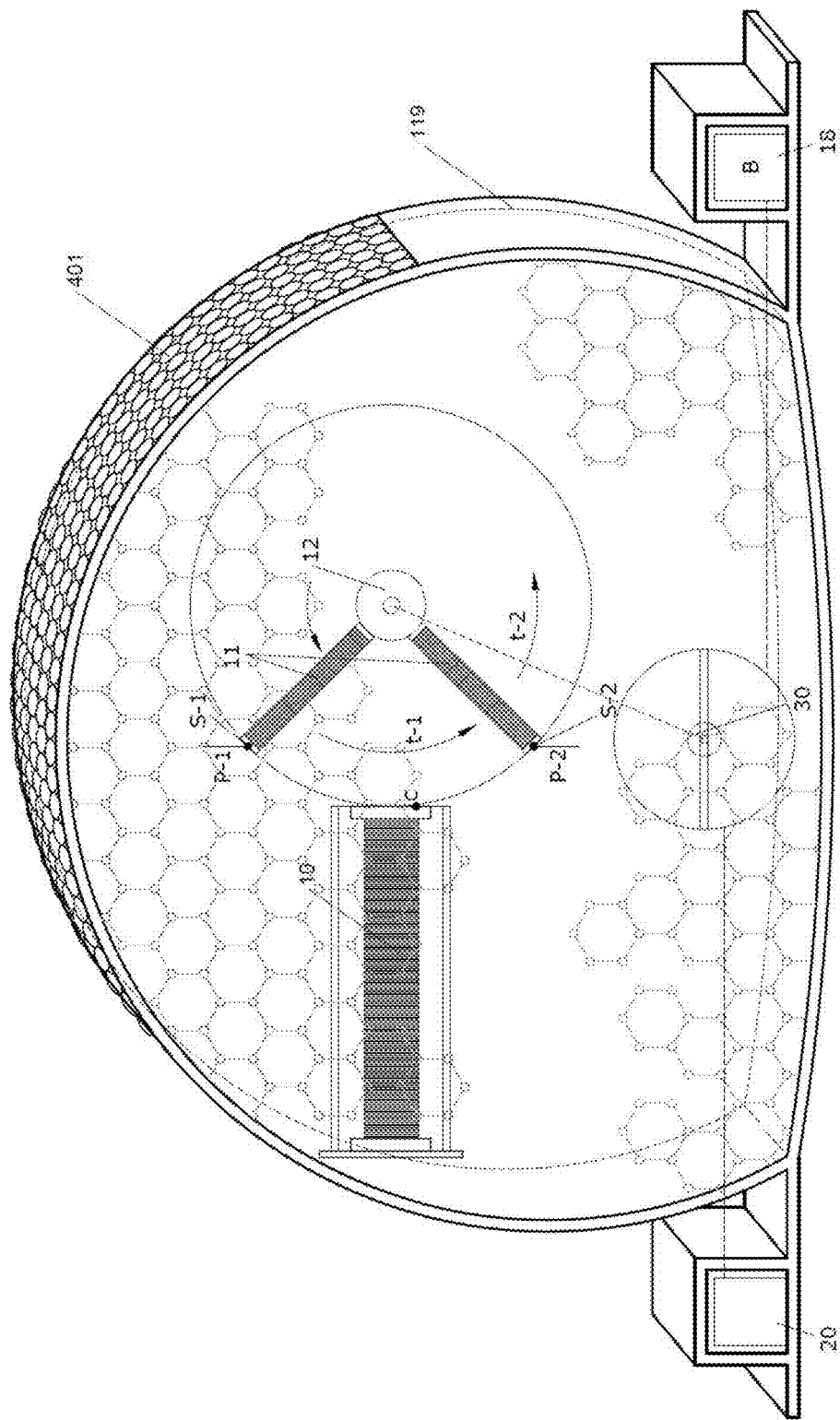
FIG. 3a shows another exemplary embodiment of an electromagnetic system with CNT (Carbon Nano-Tubes) shielding material arrangement.

Turning now to exemplary FIG. 3a, FIG. 3a may show an exemplary embodiment of an electromagnetic system with CNT (Carbon Nano-Tubes) shielding material arrangement. According to an exemplary embodiment, the system 100 may have to be rebooted because of friction and air resistance and since it is an open energy system. For this reason, a system of mico-lenses 401 with underneath photovoltaic cells (pv-cells) may be placed on roof top of building, in case of a power plant or roof of a vehicle in order to supply the needed external power supply. This rebooting may be done by the electrical motor energy stored in battery 18, supplied externally from said pv-cells, or from power stored in a flywheel 30 in order to control when to start and when to stop the rotational movement of the said flywheel 30.

Figure 4:
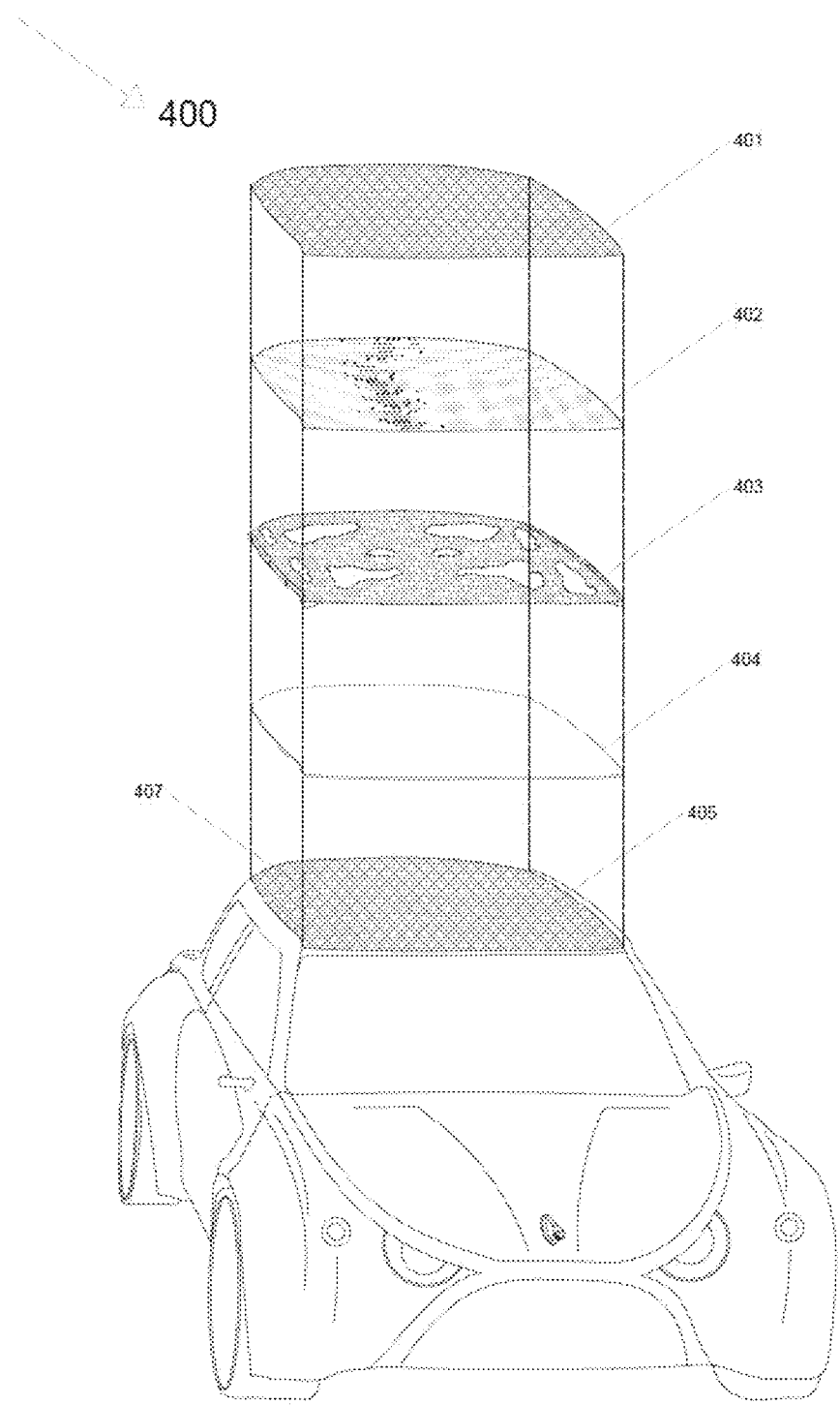
FIG. 4 shows an exemplary roof top assembly of a vehicle.

Turning now to exemplary FIG. 4, FIG. 4 may show an exemplary roof top assembly of a vehicle and/or a building configuration. According to an exemplary embodiment for a roof top assembly 400 of a vehicle, the roof top 407 may have a multilayer laminated transparent carbon fibre composite material building first the micro-lenses 401 on the top then the photovoltaic cells (pv-cells) 402 at the focal point of lenses, then optionally a transparent laminated layer as an insulator underneath the pv-cells 402, then the fractal designed T-Rex bone structure 403 and last another layer 404 of a transparent laminated carbon fibres polymers composite. The solar micro-lenses roof top 407 may be placed also on the front and rear coffin of the vehicle or motor cycle in case the vehicle has to be a convertible or the motor cycle is more sportive in appearance. In case of vehicles of convertible roof top and/or hot countries for the micro-lenses heat concentration in which case the micro-lenses solar flexible panel is then placed in front or rear or both coffins/hoods of the car to produce enough energy for the rebooting of the system.

Turning now to exemplary FIG. 4a, FIG. 4a may show an exemplary T-rex bone structure on the roof top. According to an exemplary embodiment, the roof top 407 of the vehicle may have a T-rex bone designed as a repetition of fractals like structure 403. Due to the light weight (inner spaces) and static strength of the T-Rex bone structure which is made of stronger than steel carbon fibres composite make this structure ideal for many other applications including (double-walled) buildings aero-planes and even furniture. Then, although the T-Rex bone structure has many and large empty spaces on its surface, it is, nevertheless, extremely strong statically and resilient in resisting shocks and stresses. Also, in an exemplary embodiment, the T-rex bone structure 403 on roof top 407, with the holes (empty spaces), may reduce the weight of the vehicle.

Figure 4B:
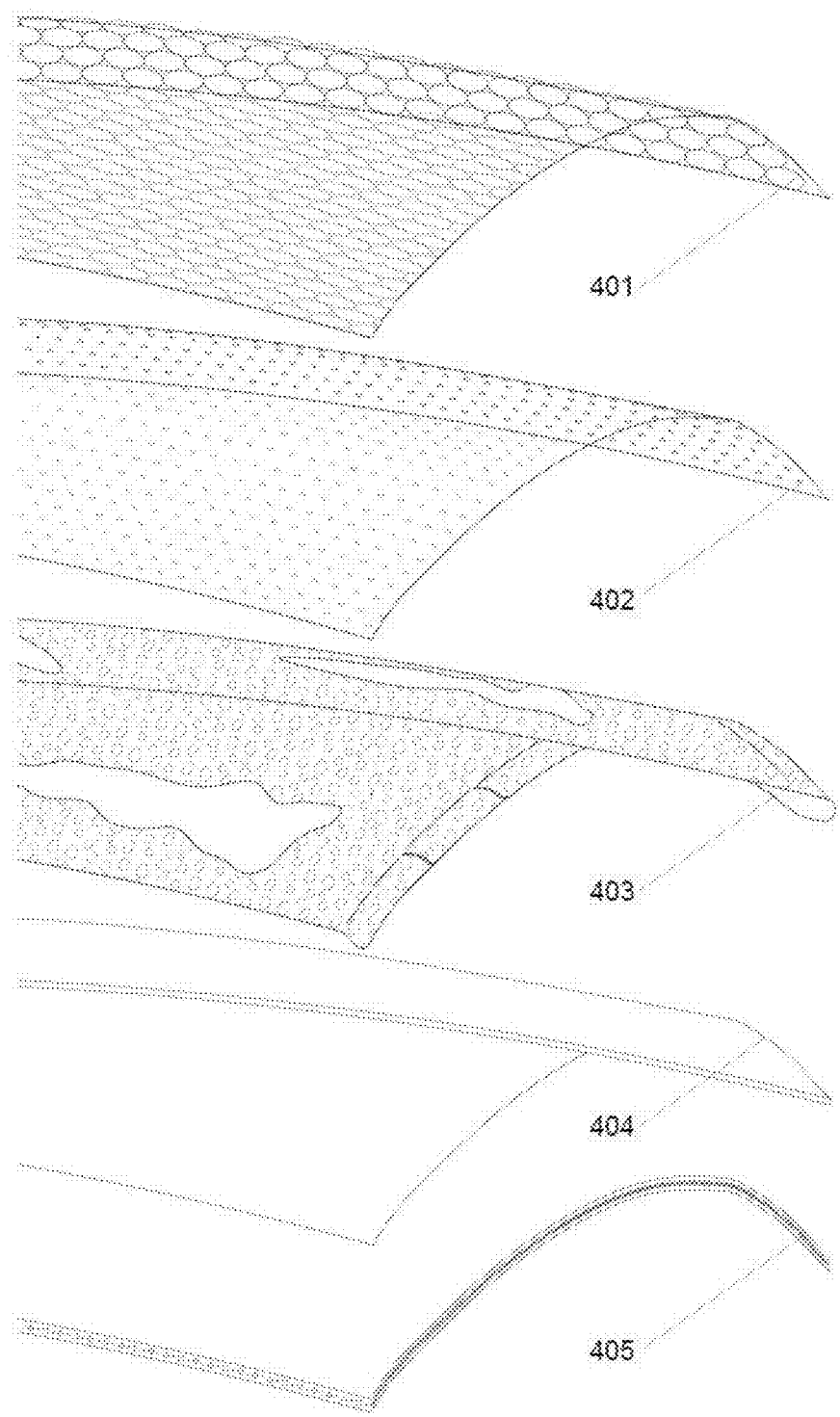
FIG. 4b shows an exemplary arrangement of the roof top.

Turning now to exemplary FIG. 4b, FIG. 4b may show an exemplary arrangement of the roof top. According to an exemplary embodiment, in the roof top 407, there may be a series of micro-lenses 401 arranged in such a way so that light can be concentrated at its focal point at which a series of solar photovoltaic cells 402 may be placed. Such pv-cells 402 may be made of gallium arsenide or any other heat resistant photovoltaic material. Further, underneath said cells 401, there may be the T-Rex shaped structure 403. Under the layer of T-Rex bone structure 403, there may be a transparent laminated sheet made of fiber glass 404 or maybe made of carbon lignin composite as explained above. Underneath the laminated sheet 404, there may be an arrangement of a series of LED bulbs.

Figure 4C:
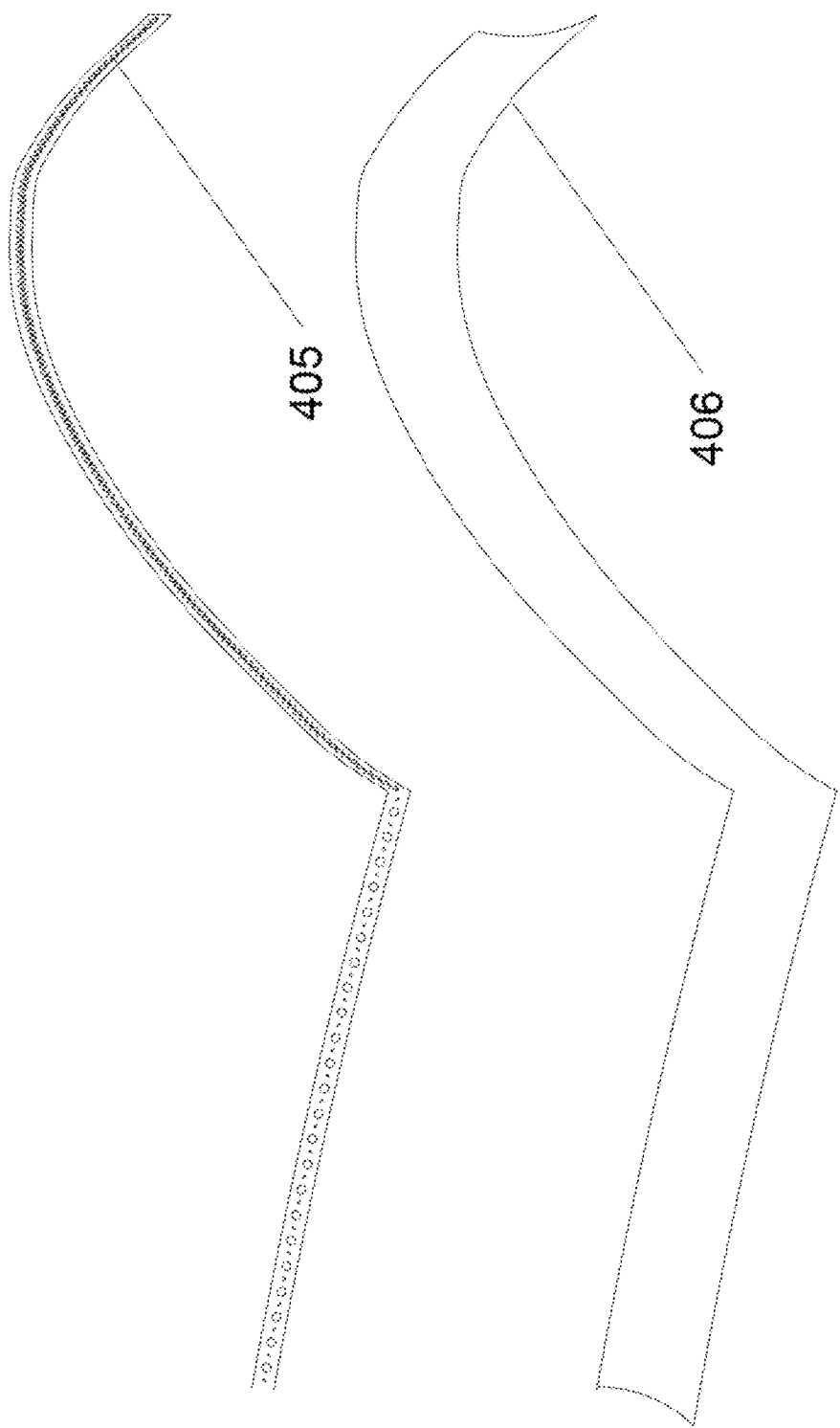
FIG. 4c shows an exemplary arrangement of a hidden/covered LED light inside a vehicle's ceiling.

Turning now to exemplary FIG. 4c, FIG. 4c may show an exemplary arrangement of a hidden/covered LED light inside a vehicle's ceiling. According to an exemplary embodiment, the arrangement of a series of LED bulbs 405 may be around the ceiling of vehicle covered with, for example, 10 cm wide structure 406 to hide these bulbs and give a comfort for the human eye in both color and intensity which could have many possible colors that may during night time.

Turning now to exemplary FIG. 5, FIG. 5 may show an exemplary thermoelectric cell.

According to an exemplary embodiment, instead of the gallium arsenide solar photovoltaic cells 402, a thermoelectric cell may be placed, as shown in FIG. 5, in which not light but heat energy of the solar energy is converted into electricity in order to recharge battery providing additional energy source to the closed system. In an exemplary embodiment, the so-called photo-switchable-molecules may work as a heat battery under which a thermos electric cell is also placed to convert stored heat at any time into electricity whenever needed and to recharge the battery in the open system. Such thermo electric cells may also be applied as paint i.e. painted in (for example, 3D printing machine). Further, there may be a material so-called photo-switchable molecules PSM (Plastarch Material) 513 which works as a heat battery storing the heat collected during daytime for the night that functions as a source of electric power and heat. In making such an embodiment, "heat battery" of PSM 513 works may be the interactions between azobenzene molecules on neighboring CNTs. PSM 513 may be a material that absorbs the sun's heat and store that energy in chemical form in combination and interaction with azobenzene, ready to be released again on demand. This combination with azobenzene may make the material efficient in heat storage of about two hundred percent increase to normal CNT material for optimal heat conductivity generated inside a container 512.

Referring still to exemplary FIG. 5, CNT may be efficient absorbers of sunlight, which convert almost the entire solar spectrum into heat. Therefore, under the focal point of the acrylic (or graphene reinforced lignin) of micro lenses, there may be a CNT layer 510 to absorb the heat from sun light and transmit it to the below PSM 513 which is a heat battery for storage during night and/or whenever as desired. The PSM 513 may be enclosed in a container 512. In an exemplary embodiment, the thermocell may also include two layers a hot layer 514 and the cold layer 516 where an isolating material 515 in between.

According to an exemplary embodiment, in order to make maximum use of the heat absorbed by the CNT 510 inside the container 512, there may be a "thermocell" immediately underneath the container 512 utilizing a low cost and earth abundant material, for example, tin solenide. The thermocell configuration made of SeSn, tin solenide which may have high Seebeck coefficient (also known as thermopower, thermoelectric power, and thermoelectric sensitivity) and high ZT (temperature-independent figure-of-merit). Such materials, tin solenide and SeSn, which is based on the common semiconductor telluride, is environmentally stable and is expected to convert from 15 to 20 percent of heat to electricity. The SeSn material may exhibit a thermoelectric figure or, for example, ZT of 2.2.

Figure 5A:
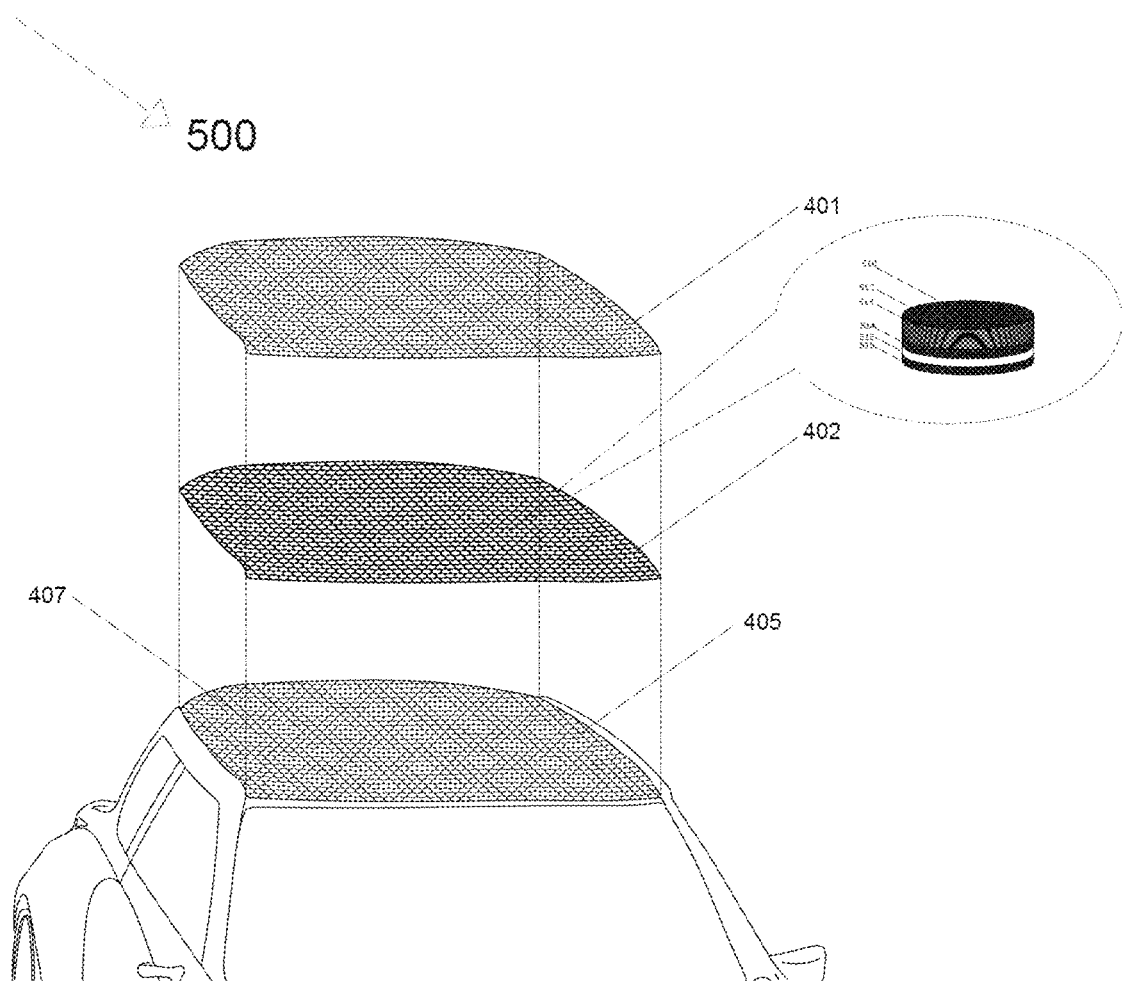
FIG. 5a shows another exemplary roof top assembly with the thermoelectric cell.

Turning now to exemplary FIG. 5a, FIG. 5a may show another exemplary roof top assembly with the thermoelectric cell. In an exemplary embodiment, the thermocell shown in FIG. 5, may be integrated in the part 402 of the roof top of the vehicle in such a way that the microlenses on top in layer 401 may concentrate the heat and light of the sun on the black area of the CNT material. Also, in an exemplary embodiment, the layer 402 may be placed at the focal point of the microlenses for maximum absorption of the solar energy.

The foregoing description and accompanying figures illustrate the principles, preferred embodiments and modes of operation of the invention. However, the invention should not be construed as being limited to the particular embodiments discussed above. Additional variations of the embodiments discussed above will be appreciated by those skilled in the art.

Therefore, the above-described embodiments should be regarded as illustrative rather than restrictive. Accordingly, it should be appreciated that variations to those embodiments can be made by those skilled in the art without departing from the scope of the invention as defined by the following claims.

What is claimed is:

1. An electro-magnetic power generator system, comprising:
   a first magnetic cylinder configured to be wrapped by a first coil;
   a second magnetic cylinder configured to be wrapped by a second coil;
   a first piston configured to be coupled to the first magnetic cylinder;
   a second piston configured to be coupled to the second magnetic cylinder;
   at least one dynamo generator configured to be coupled with the first magnetic cylinder and the second magnetic cylinder via at least one moving arm;
   at least one controller configured to coordinate oscillations of the first magnetic cylinder and the second magnetic cylinder; and
   at least one electric power storage,
   wherein the at least one controller controls the at least one electric power storage to supply a current to the first coil and the second coil for the first magnetic cylinder and the second magnetic cylinder to have a magnetic polarity creating a repulsion force against each other of the first magnetic cylinder and the second magnetic cylinder, wherein the first piston and the second piston are compressed by the repulsion force and released to push back the first magnetic cylinder and the second magnetic cylinder, and wherein the at least one dynamo generator generates an electric power by the oscillations of the first magnetic cylinder and the second magnetic cylinder, and the generated electric power is stored in the at least one electric power storage.

2. The system of claim 1 further comprises:

a wall configured to be provided between the first magnetic cylinder and the second magnetic cylinder; and at least one sensor configured to be provided at the wall, wherein the at least one sensor transmits a signal to the at least one controller in response to an impact of the first magnetic cylinder and the second magnetic cylinder.

3. The system of claim 1 wherein the at least one dynamo generator comprises:

a first dynamo generator configured to be coupled with the first magnetic cylinder via at a first moving arm; and a second dynamo generator configured to be coupled with the second magnetic cylinder via at a second moving arm.

4. The system of claim 1 further comprises at least one of a solar photovoltaic panel and a thermoelectric panel configured to supply the electric power in the at least one electric power storage.

5. The system of claim 1, wherein the at least one moving arm is a flexible moving arm made of a CNT (Carbon Nano-Tubes).

6. The system of claim 1, wherein the first magnetic cylinder and the second magnetic cylinder are magnetized in response to an impact of the first magnetic cylinder and the second magnetic cylinder and demagnetized after the impact.

7. The system of claim 1 further comprises a magnetic shielding case configured to cover the system.

8. The system of claim 1, wherein the system is encapsulated in a vacuum.

9. The system of claim 1, wherein the at least one electric power storage is a flywheel which includes a timing gear.

10. The system of claim 1, wherein the at least one dynamo generator is coupled with the at least one moving arm via a crank shaft.

11. The system of claim 1, wherein the system is encapsulated in a vacuum.

12. The system of claim 1, wherein at least one electric power storage is a flywheel which includes a timing gear.

* * * * *